United States Patent
Park et al.

(10) Patent No.: US 9,716,316 B2
(45) Date of Patent: Jul. 25, 2017

(54) SUBSTRATE EMBEDDED HORN ANTENNA HAVING SELECTION CAPABILITY OF VERTICAL AND HORIZONTAL RADIATION PATTERN

(71) Applicant: Korea Advanced Institute of Science and Technology, Daejeon (KR)

(72) Inventors: Chul Soon Park, Daejeon (KR); Hong Yi Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 264 days.

(21) Appl. No.: 14/477,562

(22) Filed: Sep. 4, 2014

(65) Prior Publication Data

US 2015/0070231 A1   Mar. 12, 2015

(30) Foreign Application Priority Data

Sep. 12, 2013  (KR) .......................... 10-2013-0109677

(51) Int. Cl.
  *H01Q 3/36*  (2006.01)
  *H01Q 3/24*  (2006.01)
  (Continued)

(52) U.S. Cl.
  CPC ............... *H01Q 3/36* (2013.01); *H01Q 3/24* (2013.01); *H01Q 13/0283* (2013.01); *H01Q 21/08* (2013.01); *H01Q 21/20* (2013.01)

(58) Field of Classification Search
  CPC .................................................... H01Q 13/02
  (Continued)

(56) References Cited

U.S. PATENT DOCUMENTS 7,623,085 B1 * 11/2009 Lier ..................... H01Q 19/08
                                                     343/771
8,319,689 B2   11/2012 Kim et al.
(Continued)

FOREIGN PATENT DOCUMENTS

JP         4972144      4/2012
KR      10-0687908      2/2007
(Continued)

*Primary Examiner* — Dameon E Levi
*Assistant Examiner* — Andrea Lindgren Baltzell
(74) *Attorney, Agent, or Firm* — H.C. Park & Associates, PLC

(57) ABSTRACT

Substrate embedded horn antenna includes a dielectric, metal patterns, metal vias and a ground plate. The metal patterns are embedded by being stacked in dielectric. Metal patterns are hollow rectangle types or hollow circle types. Metal vias connect layers of metal patterns by being embedded between layers of metal patterns. Ground plate is formed in an upper side of dielectric. Metal patterns form waveguide structure by being stacked in radial shape. Waveguide structure propagates electromagnetic wave by focusing electromagnetic wave. Embedded horn antenna capable of selectively using vertical radiation and horizontal radiation may be implemented using the via and metal pattern in dielectric substrate. Embedded horn antenna may be implemented in small size with high gain. Vertical embedded horn antenna and horizontal embedded horn antenna may be implemented in a substrate. Method of manufacturing embedded horn antenna capable of selectively using vertical radiation and horizontal radiation may be provided.

9 Claims, 18 Drawing Sheets

(51) Int. Cl.
*H01Q 13/02* (2006.01)
*H01Q 21/08* (2006.01)
*H01Q 21/20* (2006.01)

(58) Field of Classification Search
USPC .......................................................... 343/777
See application file for complete search history.

(56) References Cited

U.S. PATENT DOCUMENTS

2013/0207274 A1\* 8/2013 Liu .................. H01L 23/66
257/774
2016/0164189 A1\* 6/2016 Jafarlou ............. H01Q 21/0006
343/786

FOREIGN PATENT DOCUMENTS

| KR | 10-2009-0038805 | 4/2009 |
| KR | 10-2012-0081410 | 7/2012 |
| KR | 10-1187336 | 10/2012 |
| KR | 10-1256556 | 4/2013 |

\* cited by examiner

SUBSTRATE EMBEDDED HORN ANTENNA HAVING SELECTION CAPABILITY OF VERTICAL AND HORIZONTAL RADIATION PATTERN

CROSS-REFERENCE TO RELATED APPLICATION

This application claims priority under 35 U.S.C. §119 to Korean Patent Application No. 10-2013-0109677, filed on Sep. 12, 2013, in the Korean Intellectual Property Office (KIPO), the contents of which are herein incorporated by reference in their entirety.

BACKGROUND

1. Technical Field

Example embodiments relate generally to horn antenna capable of selectively using a horizontal radiation and a vertical radiation and more particularly to the horn antenna capable of selectively using the horizontal radiation and the vertical radiation by vertically or horizontally embedding the horn antenna in a same substrate.

2. Description of the Related Art

For a high speed data communication using millimeter wavelength and a wireless communication between communication chips, researches for various antennas are still going on. Low power consumption is required for the high speed data communication and the wireless communication. For these, a communication system may be implemented by increasing gain of the antenna. Therefore, the antenna that has high gain and narrow beam width is required. A horn antenna may be suitable for the high speed data communication using the millimeter wavelength because the horn antenna has the high gain and the narrow beam width. FIG. 1E is a diagram illustrating a radiation and the horn antenna of a horizontal direction. FIG. 1F is a diagram illustrating a radiation and the horn antenna of a vertical direction and a structure for the radiation of the horn antenna that has the high gain. However, most horn antennas are too big to apply to a mobile device. Because of the directivity of the horn antenna having high gain, to use the horn antenna in the mobile device and communication between chips is very difficult.

FIG. 1A is a diagram illustrating transmission method using a horizontal radiation pattern of a mobile device 110 and a high performance display device 150.

The transmission method in the mobile device may be illustrated using the horizontal radiation pattern of bulk data as non-compression image data. The low power transmission chip 120 and the antenna that has the horizontal radiation pattern as a Yagi-Uda antenna 130 may be integrated in a chip.

FIG. 1B is a diagram illustrating transmission method using a vertical radiation pattern of the mobile device 210 and the high performance display device 150. The transmission method in the mobile device 210 may be illustrated using the vertical radiation pattern of the bulk data as the non-compression image data. The low power transmission chip 220 and the antenna that has the vertical radiation pattern as a microstrip patch antenna 230 may be integrated in a chip FIG. 1C is a diagram illustrating a transmission method using the horizontal radiation pattern between chips CHIP1 and CHIP2 that are placed on the same board BD1. A wireless connection of a high speed interface between horizontal chips CHIP1 and CHIP2 is illustrated.

FIG. 1D is a diagram illustrating a transmission method using the vertical radiation pattern between the boards BD1 and BD2. A first board BD1 may include a first chip CHIP1 and a second board BD2 may include a second chip CHIP2. The vertical connection between the boards is illustrated. In case the mobile device using the millimeter wavelength and the high gain antenna in wireless communication is used, the radiation patterns for the horizontal direction and the vertical direction may be required. Because the antenna used in a conventional mobile device and a small device is implemented on the horizontal substrate, the radiation pattern may be one of the vertical direction or the horizontal direction. To control the direction of the radiation pattern, the user may physically change the direction or a beam forming technology that has very high power consumption may be used.

PRIOR ART REFERENCE

Patent Reference

1. Korean Patent Registration No. 10-1256556

SUMMARY

Some example embodiments provide the substrate embedded horn antenna capable of selectively using the horizontal radiation and the vertical radiation to overcome the limitation of the antenna directivity. TX-RX integrated-circuit chip may be mounted in the embedded horn antenna. The embedded horn antenna may be suitable for the high speed wireless communication using millimeter wave length because the embedded horn antenna has the high gain characteristics. The embedded horn antenna may be suitable for the mobile device and the communication between the chips because the embedded horn antenna provides the narrow beam that has various directions.

According to example embodiments, the substrate embedded horn antenna includes a dielectric, a plurality of metal patterns, a plurality of metal vias and a ground plate. The plurality of metal patterns is embedded by being stacked in the dielectric. The plurality of metal patterns is hollow rectangle types or hollow circle types. The plurality of metal vias connects layers of the metal patterns by being embedded between the layers of the metal patterns. The ground plate is formed in an upper side of the dielectric. The plurality of metal patterns forms a waveguide structure by being stacked in a radial shape. The waveguide structure propagates an electromagnetic wave by focusing the electromagnetic wave.

The substrate embedded horn antenna may include a feeding line, a resonance line and a via. The feeding line may be placed in the upper side of the dielectric and separated from the ground plate. The resonance line may be connected to a top layer of the metal patterns and the resonance line may have a length of $\lambda/4$, the $\lambda$ may be a wave length of a transfer signal. the via may connect the feeding line and the resonance line. The signal may be applied by providing the transfer signal to a waveguide implemented on a substrate and converting a TEM mode to TE01 mode.

The substrate embedded horn antenna may include a TX-RX integrated-circuit chip. The TX-RX integrated-circuit chip may be placed in the upper side of the dielectric and horizontally separated from the ground plate. a ground pad of the TX-RX integrated-circuit chip and the ground plate may be connected through a wire bonding. a signal pad of the TX-RX integrated-circuit chip and the feeding line may be connected through the wire bonding. The TX-RX integrated-circuit chip may be mounted on a cavity that is formed in the dielectric.

The substrate embedded horn antenna may include a TX-RX integrated-circuit chip. The TX-RX integrated-circuit chip may be placed in the upper side of the dielectric. a ground pad and a signal pad of the TX-RX integrated-circuit chip may be placed in a lower side of the TX-RX integrated-circuit chip. The ground pad and the ground plate may be connected through a bump. The signal pad of the TX-RX integrated-circuit chip and the feeding line may be connected through another bump.

The substrate embedded horn antenna may include the horn antenna vertically embedded in the substrate and the horn antenna horizontally embedded in the substrate where the vertical embedded horn antenna is placed.

The substrate embedded horn antenna may include a transmission line and an input switch. The transmission line may apply a signal to the horn antenna. The input switch may select an operation of the vertical embedded horn antenna and the horizontal embedded horn antenna. The input switch may be connected to a front end of the transmission line. The horizontal embedded horn antenna and the vertical embedded horn antenna may be selectively operated.

The substrate embedded horn antenna may include the horizontal embedded horn antennas and the vertical embedded horn antenna. The horn antennas may be horizontally embedded in a same layer of the substrate. The horizontal embedded horn antennas may be placed in a direction of a front side, a direction of a left side and a direction of a right side. The horn antenna may be vertically embedded in the same substrate where the horizontal embedded horn antennas are placed. The horizontal embedded horn antennas and the vertical embedded horn antenna may be selectively operated.

The substrate embedded horn antenna may include a transmission line and an input switch. The transmission line may apply a signal to the horn antenna. The input switch may select an operation of the vertical embedded horn antenna and the horizontal embedded horn antennas. The input switch may be connected to a front end of the transmission line. The horizontal embedded horn antennas and the vertical embedded horn antenna may be selectively operated.

The substrate embedded horn antenna may include the horn antennas horizontally embedded in a direction of a front side in the substrate and a power divider or a power combiner. The power divider may divide a power to the horn antenna to implement a transmitter. The power combiner may combine a power received from the horn antenna to implement a receiver The substrate embedded horn antenna may include an input switch. The input switch may select an operation of the vertical embedded horn antenna and the horizontal embedded horn antenna. The input switch may be connected to a front end of the power divider and the power combiner.

The substrate embedded horn antenna may include the horizontal embedded horn antennas, the vertical embedded horn antennas and a phase controller. The horizontal embedded horn antennas may be the horn antennas vertically embedded in the substrate. The vertical embedded horn antennas may be the horn antennas horizontally embedded in the same substrate where the vertical embedded horn antennas are placed. The phase controller may change a phase received to each horn antenna. A beam former may be implemented using the horizontal embedded horn antenna the vertical embedded horn antenna and the phase controller. The beam former may control a direction of a horizontal radiation and a vertical radiation. The beam former may select a horizontal radiation and vertical radiation.

The substrate embedded horn antenna may include an input switch. The input switch may select a vertical direction and a horizontal direction. The input switch may be connected to a front end of the phase controller. The beam former may be implemented using the input switch. The beam former may control a direction of a horizontal radiation and a vertical radiation. The beam former may select a horizontal radiation and vertical radiation.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1A:
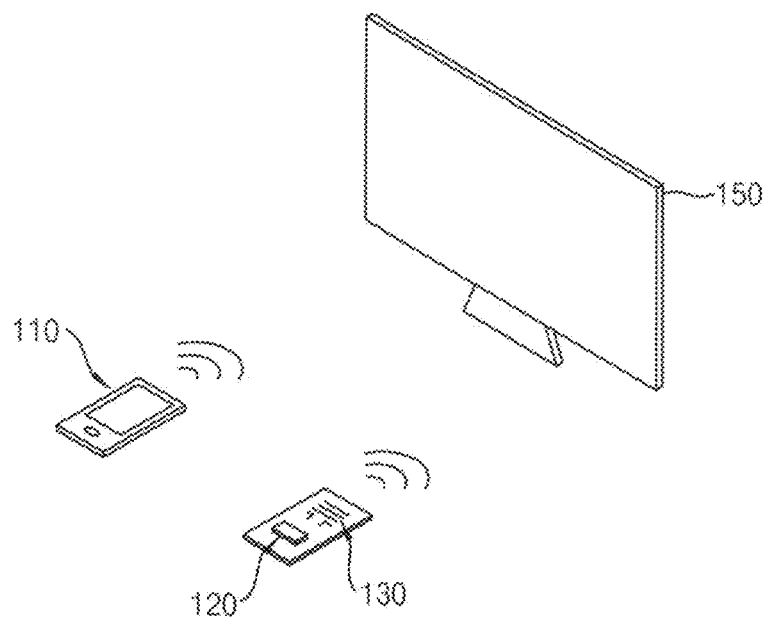
FIG. 1A is a diagram illustrating transmission method using a horizontal radiation pattern of a mobile device and a high performance display device.
Figure 1B:
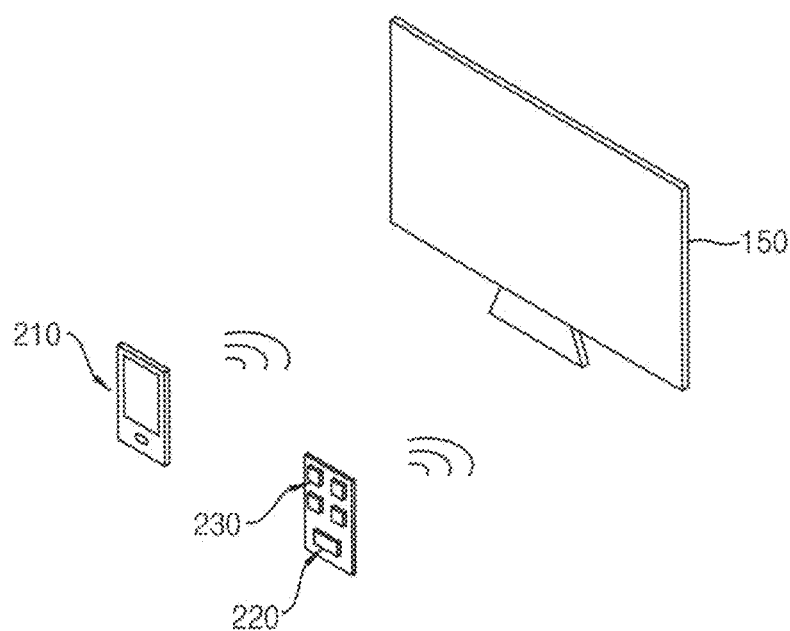
FIG. 1B is a diagram illustrating transmission method using a vertical radiation pattern of the mobile device and the high performance display device.
Figure 1C:
FIG. 1C is a diagram illustrating a transmission method using the horizontal radiation pattern between chips that are placed on the same board.
Figure 1D:
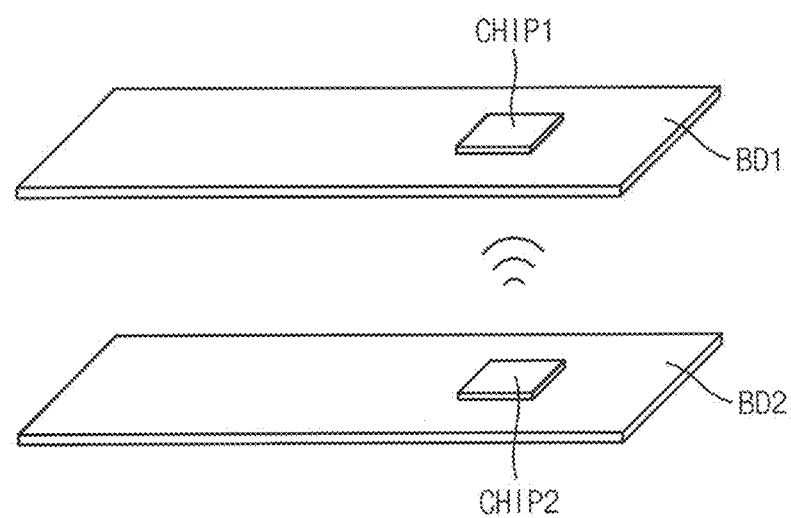
FIG. 1D is a diagram illustrating a transmission method using the vertical radiation pattern between the boards.
Figure 1E:
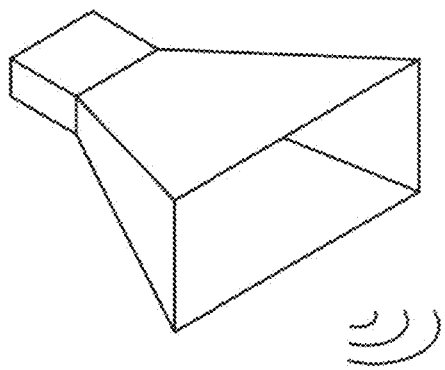
FIG. 1E is a diagram illustrating a radiation and the horn antenna of a horizontal direction.
Figure 1F:
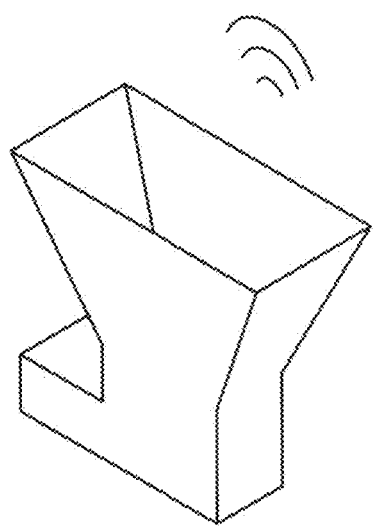
FIG. 1F is a diagram illustrating a radiation and the horn antenna of a vertical direction.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
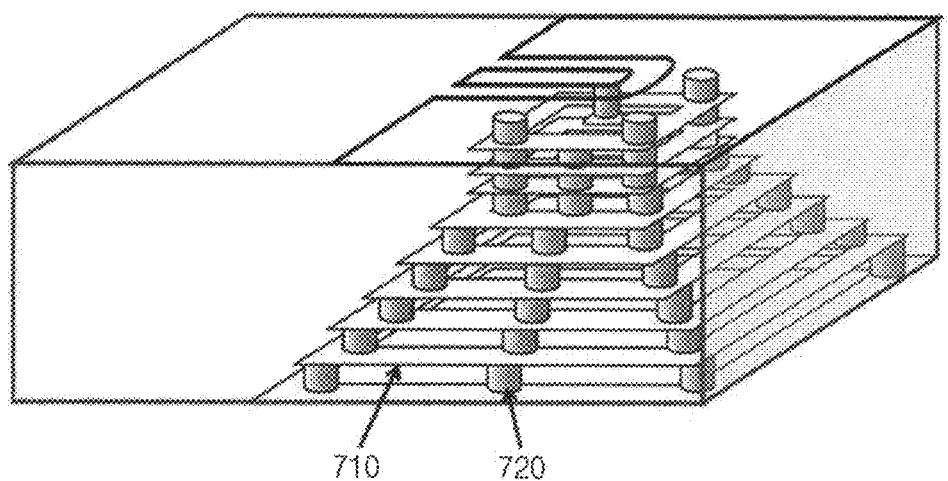
FIG. 2A is a diagram illustrating a substrate embedded horn antenna according to example embodiments.
Figure 2B:
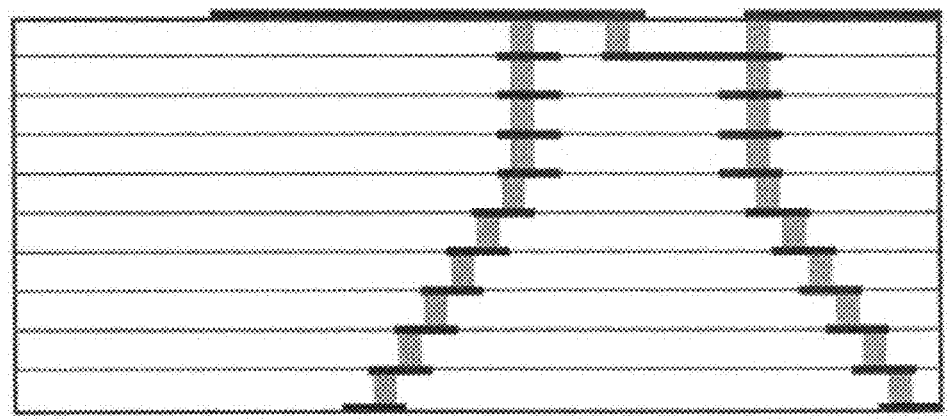
FIG. 2B is a cross-sectional diagram illustrating a substrate embedded horn antenna according to an example embodiment.

FIG. 2A is a diagram illustrating a substrate embedded horn antenna according to example embodiments and FIG. 2B is a cross-sectional diagram illustrating a substrate embedded horn antenna according to an example embodiment.

Referring to FIG. 2A and FIG. 2B, the substrate embedded horn antenna includes a dielectric, a plurality of metal patterns, a plurality of metal vias and a ground plate.

The plurality of metal patterns 710 is embedded by being stacked in the dielectric. The plurality of metal patterns 710 is hollow rectangle type or hollow circle type. The plurality of metal patterns may form a waveguide structure by being stacked in a radial shape. The waveguide structure may propagate an electromagnetic wave by focusing the electromagnetic wave.

The plurality of metal vias 720 connects layers of the metal patterns 720 by being embedded between the layers of the metal patterns. The ground plate is formed in an upper side of the dielectric.

By placing and connecting the metal patterns 710, the metal vias 720 and the ground plate in the dielectric substrate, a rectangle waveguide that propagates an electromagnetic wave by focusing the electromagnetic wave may be composed. The rectangle waveguide may radiate the electromagnetic wave as an operation of the horn antenna.

Figure 3A:
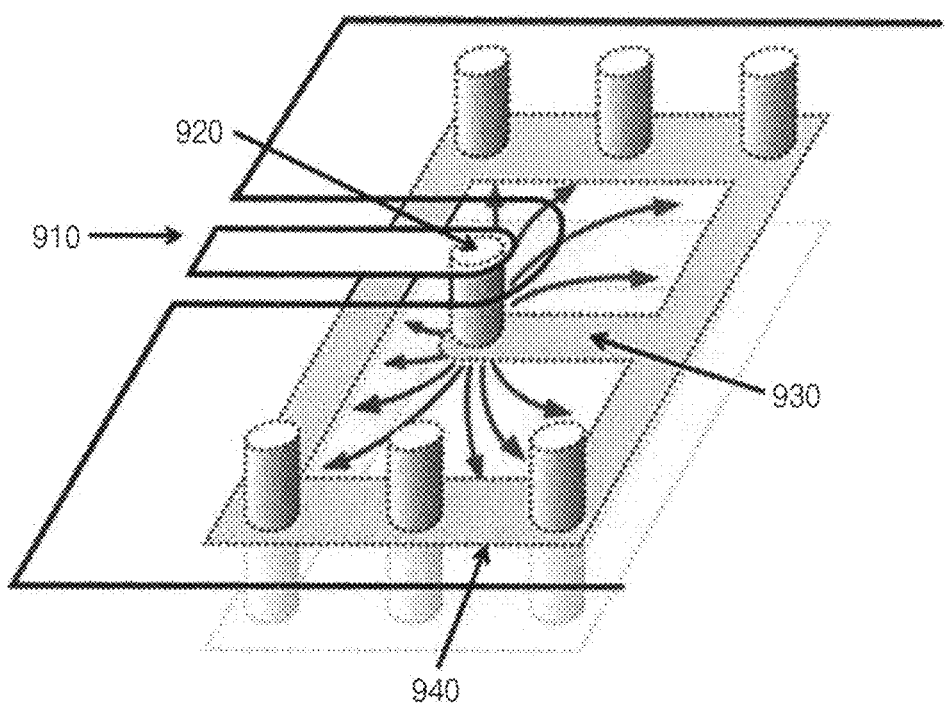
FIG. 3A is a diagram illustrating a direction of an electric field and a structure of a transfer part in a substrate embedded horn antenna according to an example embodiment.

The substrate embedded horn antenna according to example embodiments will be described in detail through FIG. 3A to FIG. 14B A First Example Embodiment FIG. 3A is a diagram illustrating a direction of an electric field and a structure of a transfer part in a substrate embedded horn antenna according to an example embodiment.

Referring to FIG. 3A, the substrate embedded horn antenna may further include a feeding line, a resonance line and a via.

The feeding line 910 may be placed in the upper side of the dielectric and separated from the ground plate. The resonance line 930 may be connected to a top layer of the metal patterns and the resonance line may have a length of $\lambda/4$, the $\lambda$ may be a wave length of a transfer signal.

The via 920 may connect the feeding line 910 and the resonance line 930. The signal may be applied by providing the transfer signal to a waveguide 940 implemented on a substrate and converting a TEM mode to TE01 mode.

By connecting the feeding line as a microstrip or a coplanar waveguide 910 to the metal via 920 and the resonance line 930, the signal may be transferred to the rectangle waveguide implemented in the substrate. The width of the rectangle waveguide 940 may be a half wave length of a predetermined frequency. The feeding line according to example embodiment may be converted from the TEM mode to the TE01 mode. The TEM mode may be a transmission mode of a line 910 as the microstrip or the coplanar waveguide. The TE01 mode may be a basic mode of the rectangle waveguide 940. The signal may be applied to the feeding line without loss.

Figure 3B:
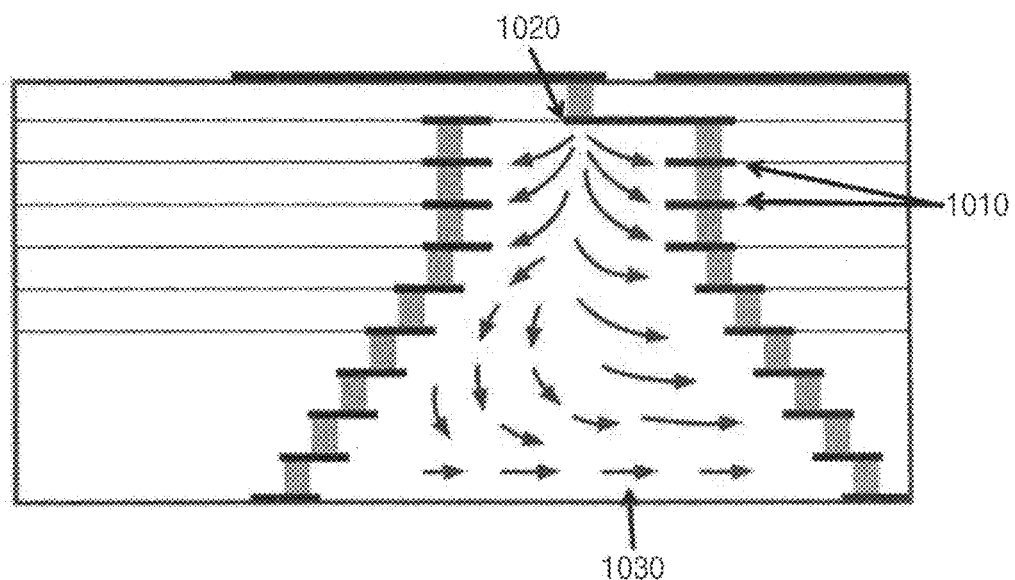
FIG. 3B is a cross-sectional diagram illustrating a substrate embedded horn antenna according to an example embodiment.

FIG. 3B is a cross-sectional diagram illustrating a substrate embedded horn antenna according to an example embodiment.

Referring to FIG. 3B, the change of the electric field is illustrated in FIG. 3B. The metal pattern 1010 as the rectangle waveguide may be infinite impedance by being connected to the ground plate through the resonance line 1020 having a quarter length of the wave length. In this case, the radiation of the electric field may be greatest. The electric field 1030 that is radiated from the end-point of the resonance line 1020 may move down following the rectangle waveguide. The electric field may be radiated by being converted to the TE01 mode that is the basic mode of the rectangle waveguide.

Figure 4:
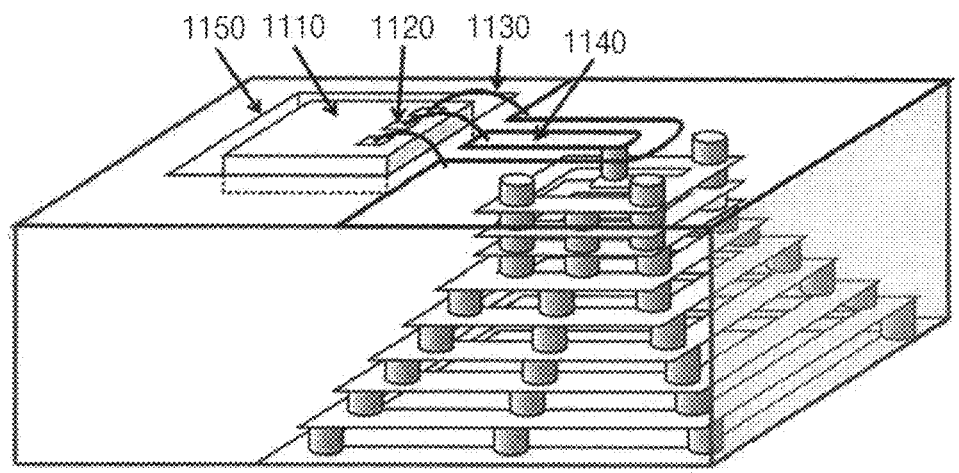
FIG. 4 is a diagram illustrating a wire bonding connection between an integrated-circuit and a substrate embedded horn antenna according to an example embodiment.

FIG. 4 is a diagram illustrating a wire bonding connection between an integrated-circuit and a substrate embedded horn antenna according to an example embodiment.

Referring to FIG. 4, the substrate embedded horn antenna may include a TX-RX integrated-circuit chip.

The TX-RX integrated-circuit chip may be placed in the upper side of the dielectric and horizontally separated from the ground plate. A ground pad of the TX-RX integrated-circuit chip 1110 and the ground plate may be connected through a wire bonding 1130. A signal pad of the TX-RX integrated-circuit chip 1110 and the feeding line may be connected through the wire bonding 1130. The TX-RX integrated-circuit chip 1110 may be mounted on a cavity that is formed in the dielectric. The signal transfer distance may be shortened using the substrate embedded horn antenna.

The signal may be transferred from the integrated-circuit by connecting the wire bonding and the metal pattern 1140 of the ground-signal-ground plate. The wire bonding may be started from the ground-signal-ground pad 1120. In this case, the integrated-circuit 1110 may be placed in the substrate using the cavity 1150 structure so that the loss is reduced by shortening the signal transfer distance FIG. 5 is a diagram illustrating a flip chip bonding connection between an integrated-circuit and a substrate embedded horn antenna according to an example embodiment.

Figure 5:
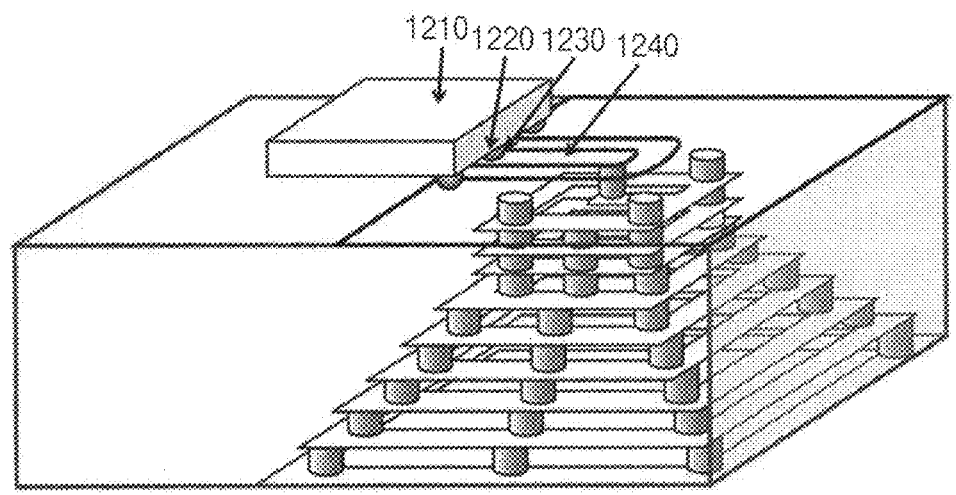
FIG. 5 is a diagram illustrating a flip chip bonding connection between an integrated-circuit and a substrate embedded horn antenna according to an example embodiment.

Referring to FIG. 5, the substrate embedded horn antenna may include a TX-RX integrated-circuit chip. The TX-RX integrated-circuit chip 1210 may be placed in the upper side of the dielectric. A ground pad and a signal pad of the TX-RX integrated-circuit chip 1210 may be placed in a lower side of the TX-RX integrated-circuit chip.

The ground pad and the ground plate may be connected through a bump. The signal pad of the TX-RX integrated-circuit chip and the feeding line may be connected through another bump.

The signal may be transferred from the ground-signal-ground pad 1220 to the metal pattern 1240 of ground-signal-ground plate through the metal bump 1230.

A manufacturing method of the substrate embedded horn antenna mounting the TX-RX integrated-circuit chip may include forming the metal pattern hole, stacking the metal pattern, forming via hole, forming metal resins via and stacking the ground plate.

Forming the metal pattern hole may be stacking the dielectric and forming the metal pattern hole in the dielectric. Stacking the metal pattern may be stacking the metal pattern of the hollow rectangle type or the hollow circle type in the metal pattern hole.

Forming via hole may be stacking the dielectric and forming a plurality of via holes in the upper side of the metal pattern. Forming metal resins via may be forming the metal via by filling the metal in the via holes.

The above steps may be repeated. The metal patterns may be stacked in the redial shape. The ground plate may be stacked in the upper side of the dielectric.

A manufacturing method of the substrate embedded horn antenna mounting the TX-RX integrated-circuit chip may further include stacking the resonance line, forming via hole and stacking the feeding line.

Stacking the resonance line may be stacking the resonance line connected to the top layer of the metal pattern. Forming via hole may be stacking the dielectric and forming the via hole in the upper side of the resonance line. Stacking the feeding line may be stacking the feeding line connected to the via hole. The feeding line may be placed in the upper side of the dielectric and separated from the ground plate.

Also, a manufacturing method of the substrate embedded horn antenna mounting the TX-RX integrated-circuit chip may further include mounting the integrated-circuit chip and connecting the wire bonding.

Mounting the integrated-circuit chip may be forming the cavity in the upper side of the dielectric horizontally separated from the ground plate and mounting the integrated-circuit chip. Connecting the wire bonding may be connecting a ground pad of the TX-RX integrated-circuit chip and the ground plate through the wire bonding and connecting a signal pad of the TX-RX integrated-circuit chip and the feeding line through the wire bonding.

A manufacturing method of the substrate embedded horn antenna mounting the TX-RX integrated-circuit chip may further include mounting the integrated-circuit chip and connecting the bump.

Mounting the integrated-circuit chip may be mounting the TX-RX integrated-circuit chip in the upper side of the ground plate. Connecting the bump may be placing a ground pad and a signal pad of the TX-RX integrated-circuit chip in a lower side of the TX-RX integrated-circuit chip, connecting the ground pad and the ground plate through a bump and connecting the signal pad of the TX-RX integrated-circuit chip and the feeding line through another bump.

A Second Example Embodiment

Figure 6A:
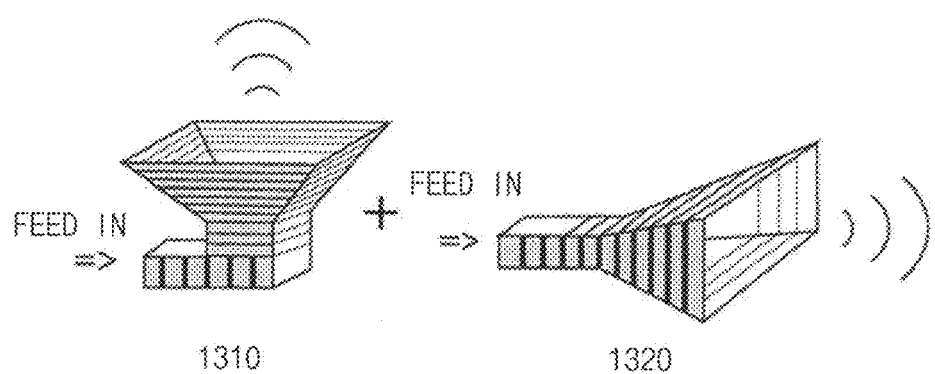
FIG. 6A is a perspective diagram illustrating a vertical radiation antenna and a horizontal radiation antenna according to another example embodiment.

FIG. 6A is a perspective diagram illustrating a vertical radiation antenna and a horizontal radiation antenna according to another example embodiment.

Referring to FIG. 6A, method of integrating the substrate embedded horn antenna capable of selectively using the vertical radiation 1320 and the horizontal radiation 1310 in the substrate is illustrated in FIG. 6A. The substrate embedded horn antenna capable of selectively using the vertical radiation and the horizontal radiation may include the horn antenna 1410 vertically embedded in the substrate and the horn antenna 1420 horizontally embedded in the substrate 1430 where the vertical embedded horn antenna is placed.

The substrate embedded horn antenna includes a dielectric, a plurality of metal patterns, a plurality of metal vias and a ground plate. The plurality of metal patterns is embedded by being stacked in the dielectric. The plurality of metal patterns is hollow rectangle types or hollow circle types. The plurality of metal vias connects layers of the metal patterns by being embedded between the layers of the metal patterns. The ground plate is formed in an upper side of the dielectric. The plurality of metal patterns forms a waveguide structure by being stacked in a radial shape. The waveguide structure propagates an electromagnetic wave by focusing the electromagnetic wave. The substrate embedded horn antenna includes the horn antenna vertically embedded in the substrate and the horn antenna horizontally embedded in the substrate where the vertical embedded horn antenna is placed. The vertical radiation and the horizontal radiation may be selectively used. Each of the horn antennas may be the structure of the substrate embedded horn antenna of FIG. 2A.

Figure 6B:
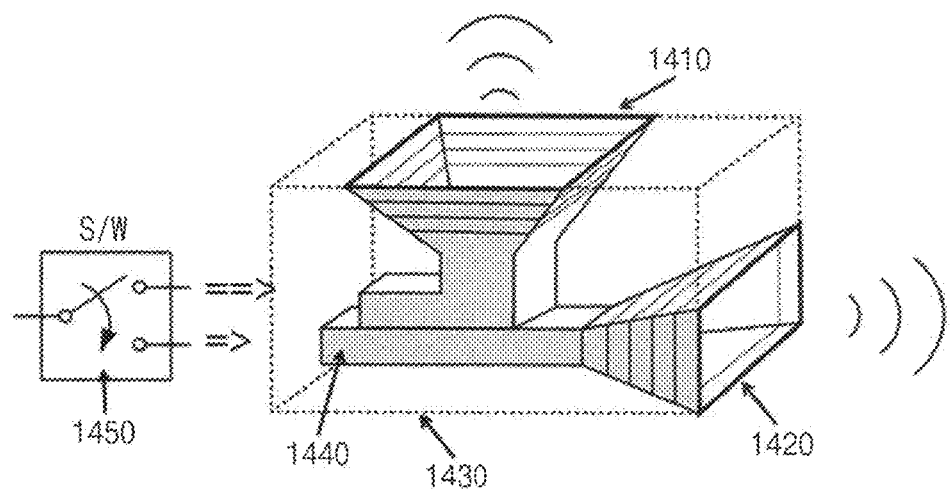
FIG. 6B is a diagram illustrating a switch connection between a vertical radiation antenna and a horizontal radiation antenna according to still another example embodiment.

FIG. 6B is a diagram illustrating a switch connection between a vertical radiation antenna and a horizontal radiation antenna according to still another example embodiment.

The substrate embedded horn antenna capable of selectively using the vertical radiation and the horizontal radiation may further include a transmission line and an input switch.

The transmission line may apply a signal to the horn antenna. The input switch may select an operation of the vertical embedded horn antenna and the horizontal embedded horn antenna. The input switch may be connected to a front end of the transmission line. The horizontal embedded horn antenna and the vertical embedded horn antenna may be selectively operated. The SPDT switch 1450 that selects the horizontal embedded horn antenna and the vertical embedded horn antenna may be placed in front of the strip transmission line and The SPDT switch 1450 may select the operation of the horizontal embedded horn antenna and the vertical embedded horn antenna.

Figure 6C:
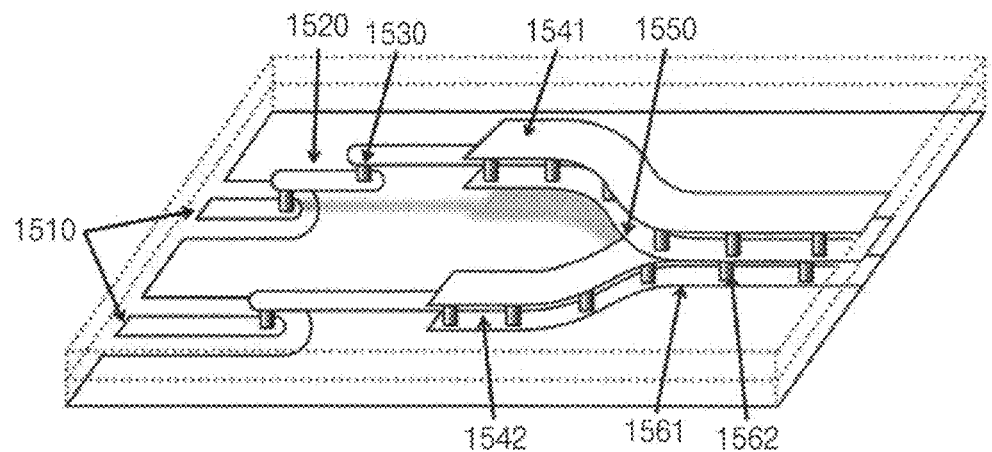
FIG. 6C is a diagram illustrating a transferring method of a vertical radiation antenna and a horizontal radiation antenna according to still another example embodiment.

FIG. 6C is a diagram illustrating a transferring method of a vertical radiation antenna and a horizontal radiation antenna according to still another example embodiment.

Referring to FIG. 6C, the signal may be transferred to the strip line 1 1541 and the strip line 2 1542 through the signal line 1520 and the metal via 1530 by applying the signal to the coplanar waveguide or the microstrip line. Each strip line may be connected to the horizontal radiation antenna and the vertical radiation antenna through intersection 1550. In this case, the strip line may be rectangle waveguide including the metal pattern 1561 and the vertical metal via 1562.

A Third Example Embodiment

Figure 7A:
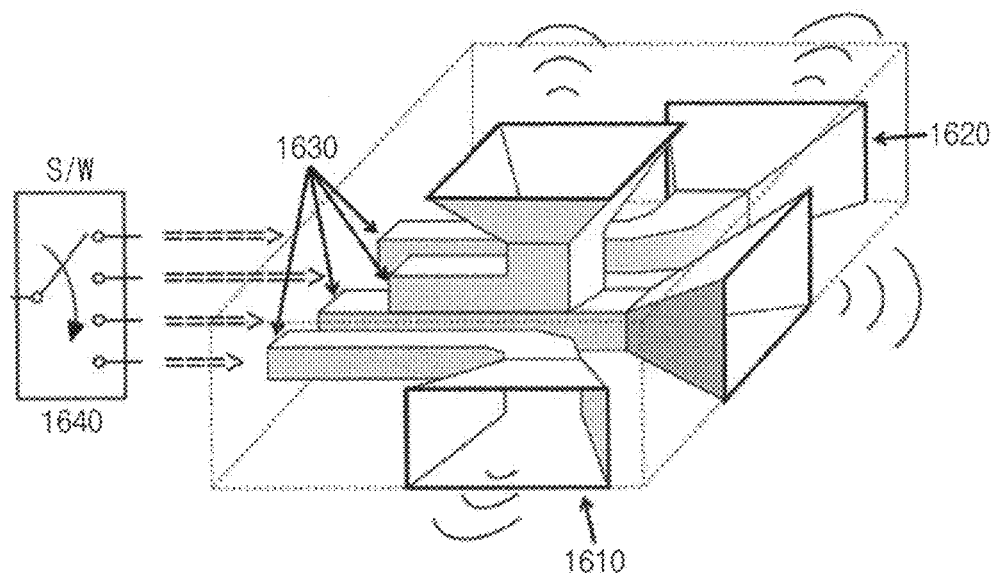
FIG. 7A is a diagram illustrating a switch connection to substrate embedded antennas capable of radiating by selecting a direction of an upper side, a direction of a front side, a direction of a left side and a direction of a right side according to still another example embodiment.

FIG. 7A is a diagram illustrating a switch connection to substrate embedded antennas capable of radiating by selecting a direction of an upper side, a direction of a front side, a direction of a left side and a direction of a right side according to still another example embodiment.

Referring to FIG. 7A, the substrate embedded horn antenna may include the horizontal embedded horn antennas and the vertical embedded horn antenna. The horn antennas may be horizontally embedded in a same layer of the substrate. The horizontal embedded horn antennas may be placed in a direction of a front side, a direction of a left side and a direction of a right side. The horn antenna may be vertically embedded in the same substrate where the horizontal embedded horn antennas are placed. The horizontal embedded horn antennas and the vertical embedded horn antenna may be selectively operated.

The substrate embedded horn antenna includes a dielectric, a plurality of metal patterns, a plurality of metal vias and a ground plate. The plurality of metal patterns is embedded by being stacked in the dielectric. The plurality of metal patterns is hollow rectangle types or hollow circle types. The plurality of metal vias connects layers of the metal patterns by being embedded between the layers of the metal patterns. The ground plate is formed in an upper side of the dielectric. The plurality of metal patterns forms a waveguide structure by being stacked in a radial shape. The waveguide structure propagates an electromagnetic wave by focusing the electromagnetic wave.

The horizontal embedded horn antennas may be placed in a direction of a front side, a direction of a left side and a direction of a right side. The horn antenna may be vertically embedded in the same substrate where the horizontal embedded horn antennas are placed. The horizontal embedded horn antennas and the vertical embedded horn antenna may be selectively operated.

The substrate embedded horn antenna may include a transmission line and an input switch. The transmission line may apply a signal to the horn antenna. The input switch may select an operation of the vertical embedded horn antenna and the horizontal embedded horn antennas. The input switch may be connected to a front end of the transmission line. The horizontal embedded horn antennas and the vertical embedded horn antenna may be selectively operated.

The substrate embedded horn antenna capable of selectively using four direction radiation patterns may be implemented. If the substrate embedded horn antennas are added in both sides 1610, 1620 of the horn antenna of FIG. 6B, the four direction radiation patterns may be used. Each substrate embedded horn antenna may be composed of the metal pattern and metal via of the substrate embedded horn antenna of FIG. 2A. The SP4T switch may be connected to the four strip line 1630 to select the radiation direction.

Figure 7B:
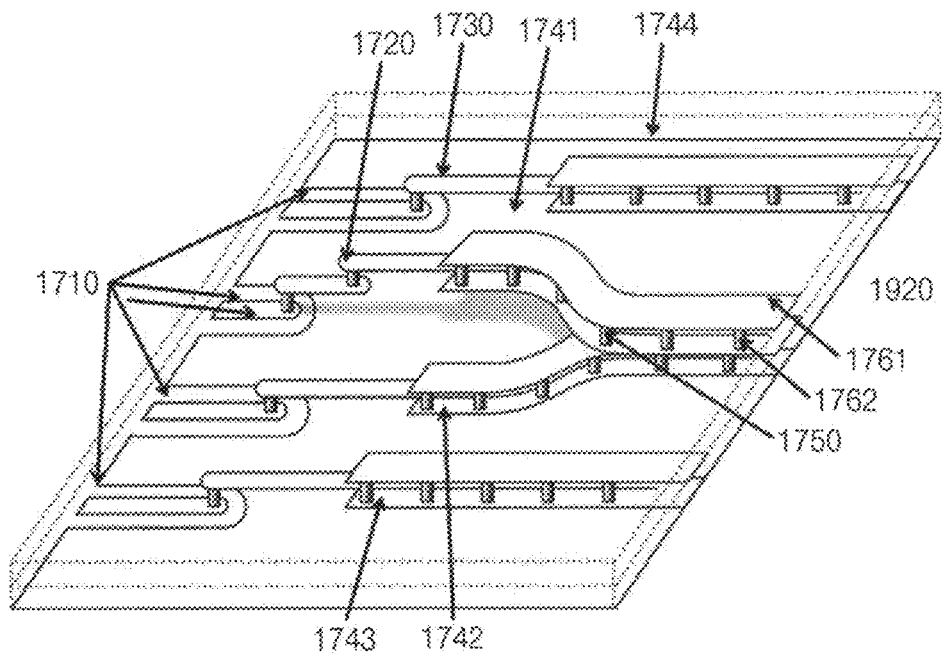
FIG. 7B is a diagram illustrating a transferring method to substrate embedded antennas capable of radiating by selecting a direction of an upper side, a direction of a front side, a direction of a left side and a direction of a right side according to still another example embodiment.

FIG. 7B is a diagram illustrating a transferring method to substrate embedded antennas capable of radiating by selecting a direction of an upper side, a direction of a front side, a direction of a left side and a direction of a right side according to still another example embodiment.

Referring to FIG. 7B, the signal may be transferred to the strip line 1 1741, the strip line 2 1742, the strip line 3 1743 and the strip line 4 1744 through the signal line 1720 and the metal via 1730 by applying the signal to the coplanar waveguide 1710 or the microstrip line. the strip line 1 1741, the strip line 2 1742, the strip line 3 1743 and the strip line 4 1744 may be placed in different heights.

Each strip line for the front and vertical radiation may be connected to the horizontal radiation antenna and the vertical radiation antenna through intersection 1750. Each strip line 1743, 1744 for the left and right radiation may be connected to each antenna. In this case, the strip line may be rectangle waveguide including the metal pattern 1761 and the vertical metal via 1762 to isolate the signal.

A Fourth Example Embodiment

Figure 8:
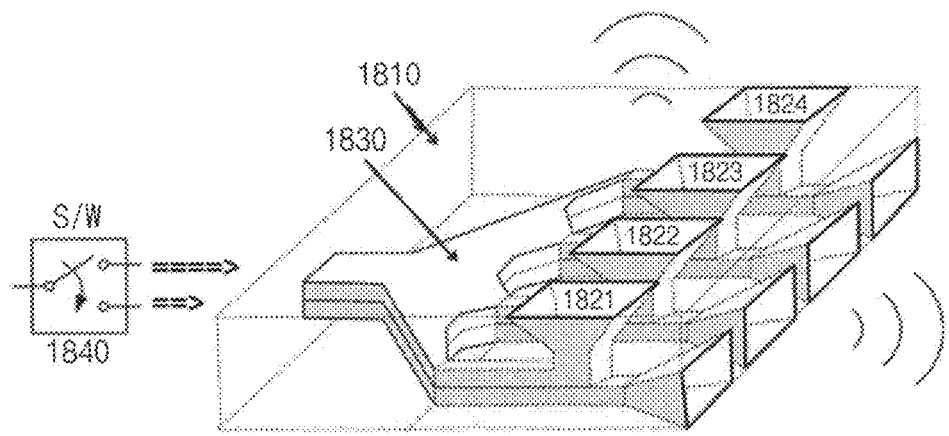
FIG. 8 is a diagram illustrating substrate embedded horn antennas having a plurality of vertical radiations and horizontal radiation according to still another example embodiment.

FIG. 8 is a diagram illustrating substrate embedded horn antennas having a plurality of vertical radiations and horizontal radiation according to still another example embodiment.

Referring to FIG. 8, the substrate embedded horn antenna may include the horn antennas horizontally embedded in a direction of a front side in the substrate and a power divider or a power combiner.

The substrate embedded horn antenna includes a dielectric, a plurality of metal patterns, a plurality of metal vias and a ground plate. The plurality of metal patterns is embedded by being stacked in the dielectric. The plurality of metal patterns is hollow rectangle types or hollow circle types. The plurality of metal vias connects layers of the metal patterns by being embedded between the layers of the metal patterns. The ground plate is formed in an upper side of the dielectric. The plurality of metal patterns forms a waveguide structure by being stacked in a radial shape. The waveguide structure propagates an electromagnetic wave by focusing the electromagnetic wave.

The plurality of the vertical embedded horn antennas may be aligned to the front side direction in the same layer of the substrate. The plurality of the horizontal embedded horn antennas may be aligned to the upper side direction in the same substrate. The power divider may divide a power to the horn antenna to implement a transmitter. The power combiner may combine a power received from the horn antenna to implement a receiver.

The substrate embedded horn antenna may include an input switch. The input switch may select an operation of the vertical embedded horn antenna and the horizontal embedded horn antenna. The input switch may be connected to a front end of the power divider and the power combiner. The vertical radiation and the horizontal radiation may be selectively used.

The substrate embedded horn antenna capable of selectively using the vertical embedded horn antennas and the horizontal embedded horn antennas may be suitable for the application area requiring the bigger gain and the narrower beam width. In FIG. 8, four horn antennas 1821, 1822, 1823 and 1824 are illustrated. However, the bigger gain and the narrower beam width may be implemented using the more horn antennas. In case the four horn antennas are used as the transmitters, the 4:1 power divider 1830 may be used. In case the four horn antennas are used as the receivers, the 4:1 power combiner may be used. The signal may be selected using the SPDT switch 1840 that selects the vertical radiation and the horizontal radiation.

A Fifth Example Embodiment

Figure 9:
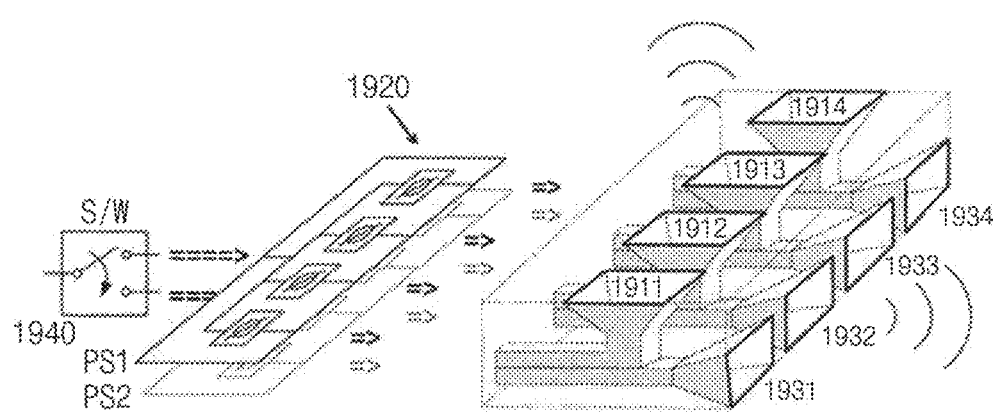
FIG. 9 is a diagram illustrating a beam former composed by connecting substrate embedded horn antennas having a plurality of vertical radiations and horizontal radiation according to still another example embodiment.

FIG. 9 is a diagram illustrating a beam former composed by connecting substrate embedded horn antennas having a plurality of vertical radiations and horizontal radiation according to still another example embodiment.

Referring to FIG. 9, the substrate embedded horn antenna may further include the horizontal embedded horn antennas, the vertical embedded horn antennas and a phase controller.

The substrate embedded horn antenna includes a dielectric, a plurality of metal patterns, a plurality of metal vias and a ground plate. The plurality of metal patterns is embedded by being stacked in the dielectric. The plurality of metal patterns is hollow rectangle types or hollow circle types. The plurality of metal vias connects layers of the metal patterns by being embedded between the layers of the metal patterns. The ground plate is formed in an upper side of the dielectric. The plurality of metal patterns forms a waveguide structure by being stacked in a radial shape. The waveguide structure propagates an electromagnetic wave by focusing the electromagnetic wave.

The horizontal embedded horn antennas may be the horn antennas vertically embedded in the substrate. The vertical embedded horn antennas may be the horn antennas horizontally embedded in the same substrate where the vertical embedded horn antennas are placed. The phase controller may change a phase received to each horn antenna. A beam former may be implemented using the horizontal embedded horn antenna the vertical embedded horn antenna and the phase controller. The beam former may control a direction of a horizontal radiation and a vertical radiation. The beam former may select a horizontal radiation and vertical radiation.

The substrate embedded horn antenna may further include an input switch. The input switch may select a vertical direction and a horizontal direction. The input switch may be connected to a front end of the phase controller. The beam former may be implemented using the input switch. The beam former may control a direction of a horizontal radiation and a vertical radiation. The beam former may select a horizontal radiation and vertical radiation.

FIG. 9 is a diagram illustrating a beam former composed by connecting substrate embedded horn antennas having a plurality of vertical radiations and horizontal radiation according to still another example embodiment.

Referring to FIG. 9, each phase controller 1920 may be connected to the four vertical embedded horn antennas 1911, 1912, 1913 and 1914. Each phase controller 1920 may be connected to the four horizontal embedded horn antennas 1931, 1932, 1933 and 1934. The direction of the vertical radiation and the horizontal radiation may be controlled using the phase controller. The SPDT switch 1940 may be connected to an input to select the vertical direction and the horizontal direction.

Figure 10A:
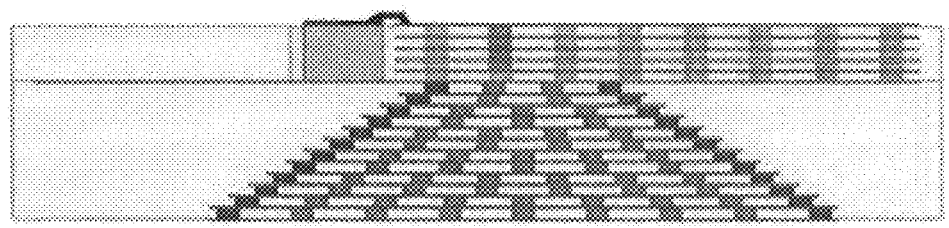
FIG. 10A is a cross-sectional diagram illustrating a structure of a substrate embedded horn antenna implemented using 3-D EM simulation according to an example embodiment.
Figure 11:
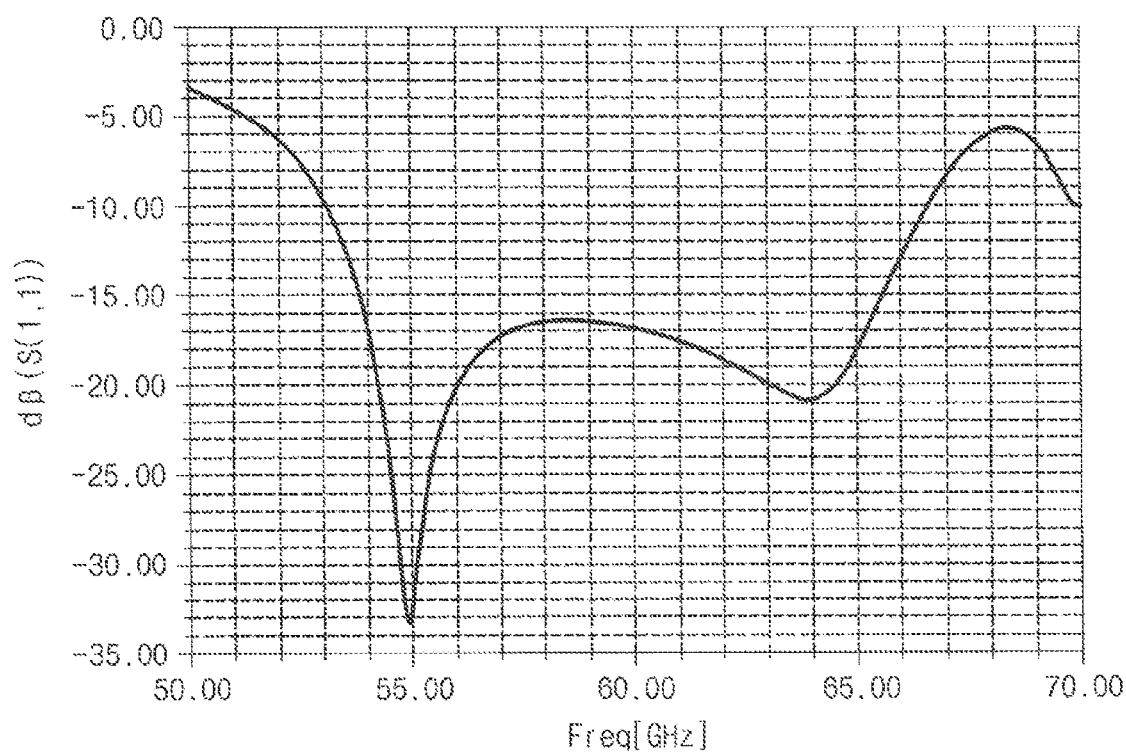
FIG. 11 is a diagram illustrating a reflection loss of a substrate embedded horn antenna according to an example embodiment.

FIG. 10A is a cross-sectional diagram illustrating a structure of a substrate embedded horn antenna implemented using 3-D EM simulation according to an example embodiment and FIG. 11 is a diagram illustrating a reflection loss of a substrate embedded horn antenna according to an example embodiment and FIG. 12 is a diagram illustrating a radiation pattern and 3-D beam pattern in 60 GHz that is a frequency of a substrate embedded horn antenna according to an example embodiment.

Figure 10B:
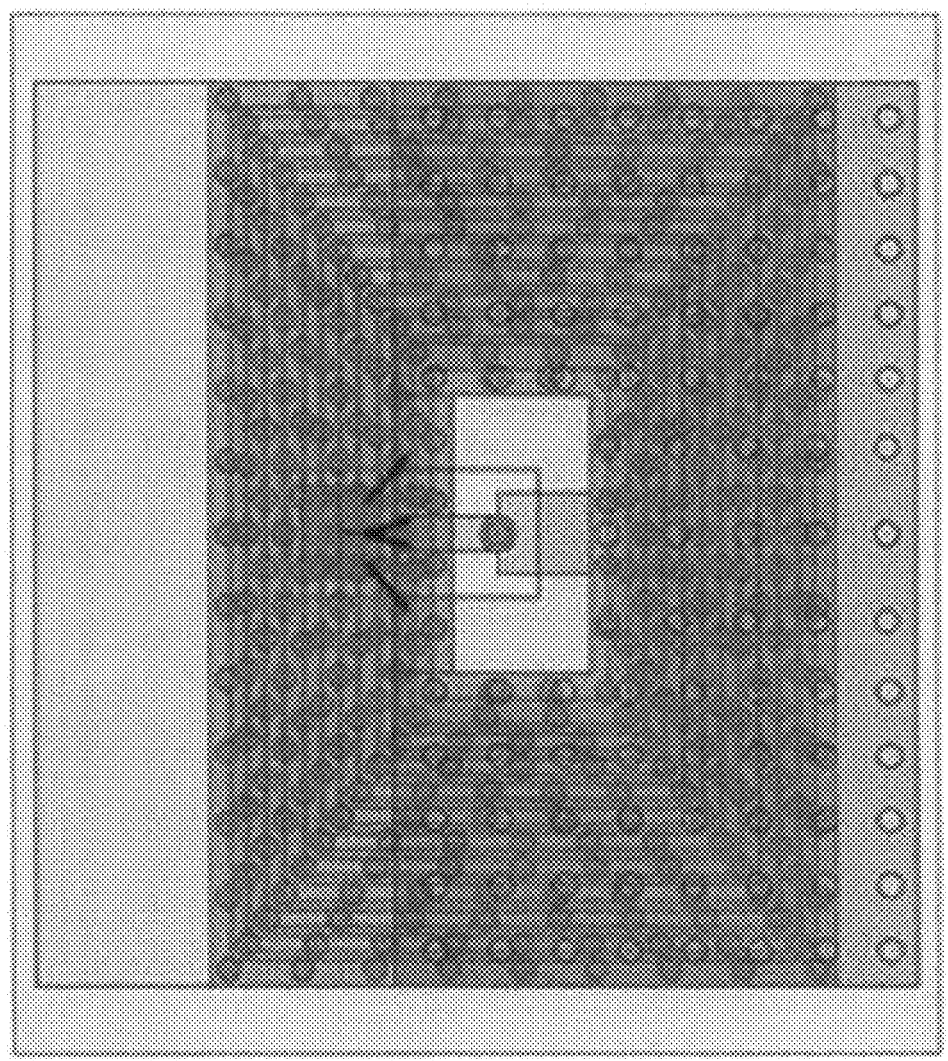
FIG. 10B is a plane diagram illustrating a structure of a substrate embedded horn antenna implemented using 3-D EM simulation according to an example embodiment.
Figure 10C:
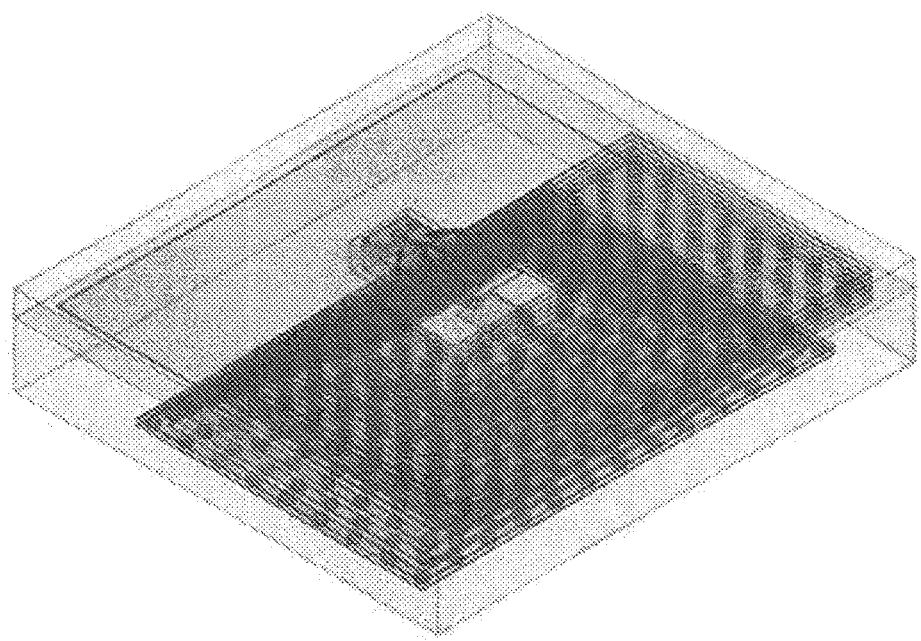
FIG. 10C is a diagram illustrating a structure of a substrate embedded horn antenna implemented using 3-D EM simulation according to an example embodiment.

Referring to FIGS. 11, 12a, 12b and 12c, the operation characteristic of the one substrate embedded horn antenna according to example embodiments is illustrated. In FIGS. 10a, 10b and 10c, the simulation result is added to describe the capability of implementing the example embodiments. In this case, the dielectric substrate is used the LTCC substrate (low temperature co-fired ceramic, LTCC). The dielectric constant is 5.9, the loss tangent is 0.0035 and the metal is Ag.

The width of the aperture of the embedded horn antenna is 3.4 mm and the length of the aperture is 2.4 mm. The width of the substrate including the CMOS chip is 4.5 mm and the length of the substrate is 5 mm and the height of the substrate is 0.85 mm. The result of the example embodiment may be applied to various substrates (PCB, Duroid, Taconic, Ceramic).

FIG. 11 is a diagram illustrating a reflection loss of a substrate embedded horn antenna according to an example embodiment. Referring to FIG. 11, the bandwidth less than −10 dB may be 13 GHz bandwidth from 53 GHz to 66 GHz.

Figure 12A:
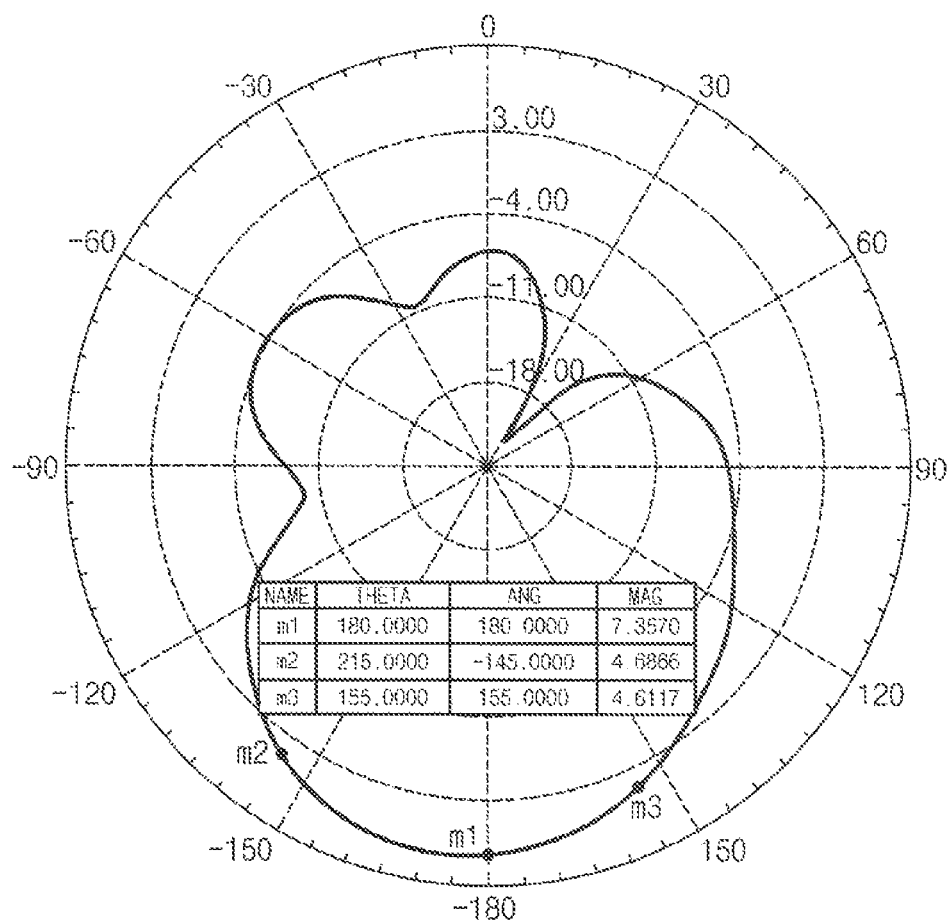
FIG. 12A is a diagram illustrating an E plane radiation pattern in 60 GHz that is a frequency of a substrate embedded horn antenna according to an example embodiment.

FIG. 12A is a diagram illustrating an E plane radiation pattern in 60 GHz that is a frequency of a substrate embedded horn antenna according to an example embodiment. Referring to FIG. 12A, the maximum gain may be 7.35 dBi and the HPBW (half power beam width, HPBW) may be 60°(±30°).

Figure 12B:
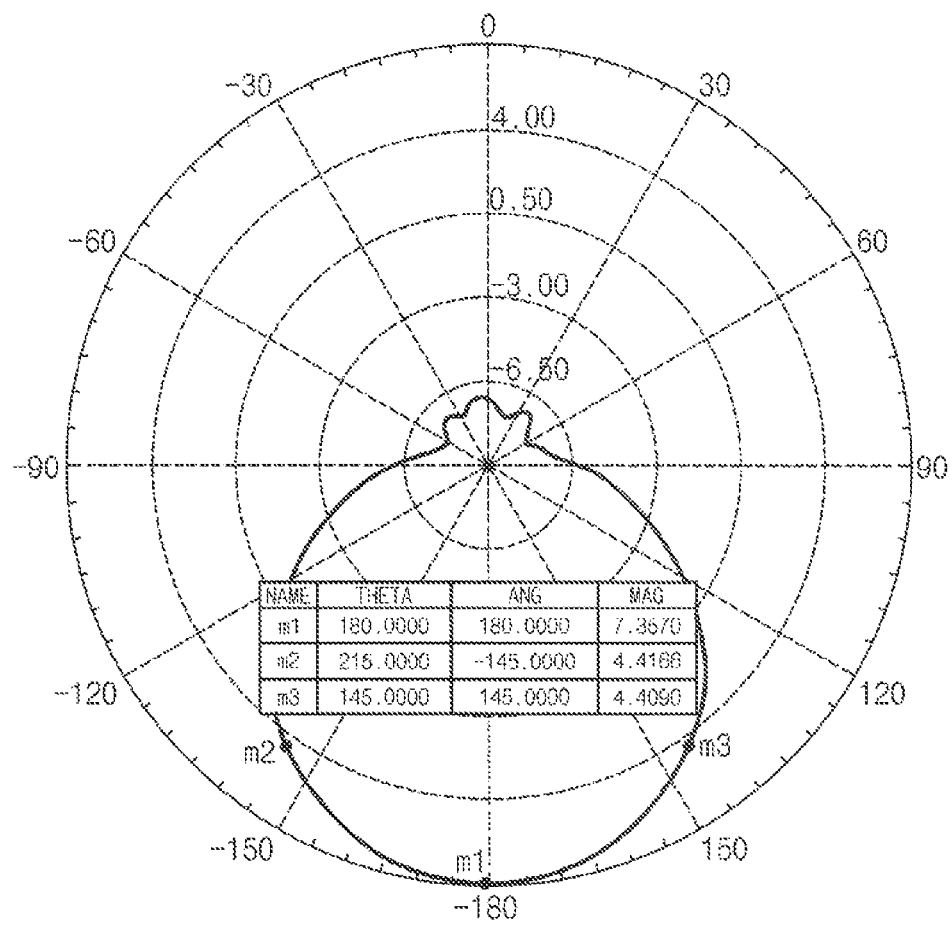
FIG. 12B is a diagram illustrating an H plane radiation pattern in 60 GHz that is a frequency of a substrate embedded horn antenna according to an example embodiment.

FIG. 12B is a diagram illustrating an H plane radiation pattern in 60 GHz that is a frequency of a substrate embedded horn antenna according to an example embodiment. Referring to FIG. 12B, the maximum gain may be 7.35 dBi and the HPBW (half power beam width, HPBW) may be 70°(±35°).

Figure 12C:
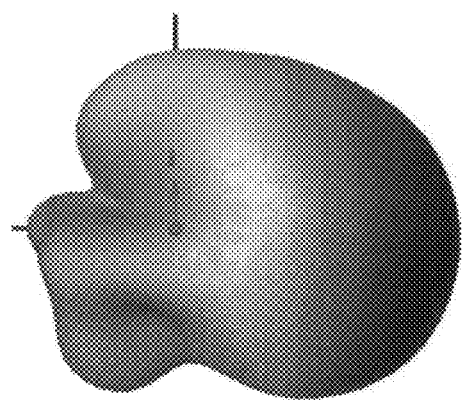
FIG. 12C is a diagram illustrating a 3D beam pattern in 60 GHz that is a frequency of a substrate embedded horn antenna according to an example embodiment.

FIG. 12c is a diagram illustrating a 3D beam pattern in 60 GHz that is a frequency of a substrate embedded horn antenna according to an example embodiment.

FIG. 13 is a cross-sectional diagram illustrating a structure of a substrate embedded vertical radiation antenna and horizontal radiation antenna implemented using 3-D EM simulation according to another example embodiment and FIG. 14 is a diagram illustrating a beam pattern of a vertical direction in case a signal is applied by selecting a vertical radiation of a substrate embedded horn antenna according to another example embodiment.

Figure 14A:
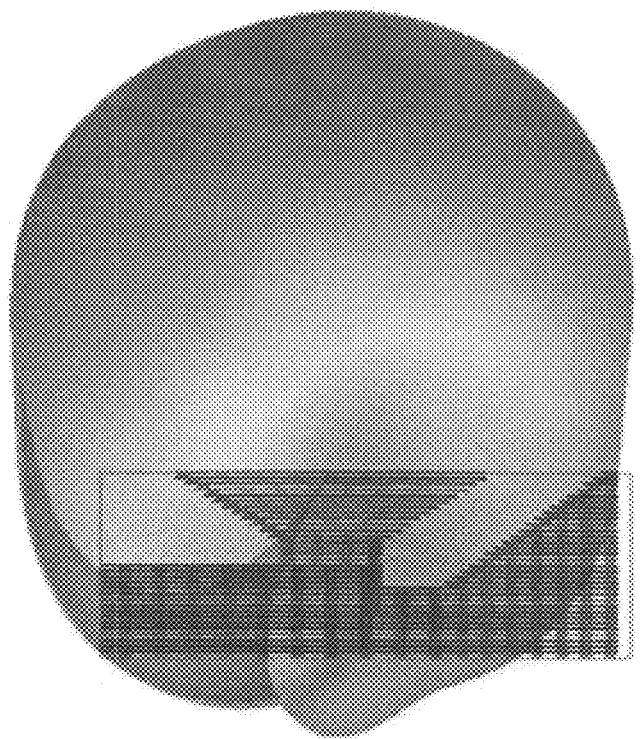
FIG. 14A is a diagram illustrating a beam pattern of a vertical direction in case a signal is applied by selecting a vertical radiation of a substrate embedded horn antenna according to another example embodiment.
Figure 14B:
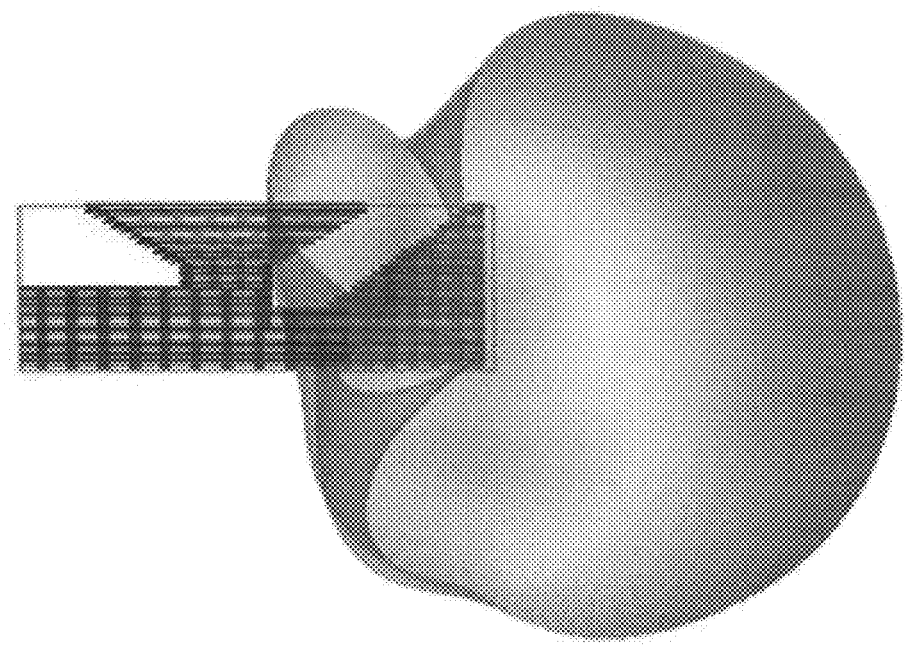
FIG. 14B is a diagram illustrating a beam pattern of a horizontal direction in case a signal is applied by selecting a horizontal radiation of a substrate embedded horn antenna according to another example embodiment.

Referring to FIGS. 14A and 14b, the operation characteristic of the substrate embedded horn antenna capable of selectively using the vertical radiation and the horizontal radiation according to example embodiments is illustrated.

Figure 13A:
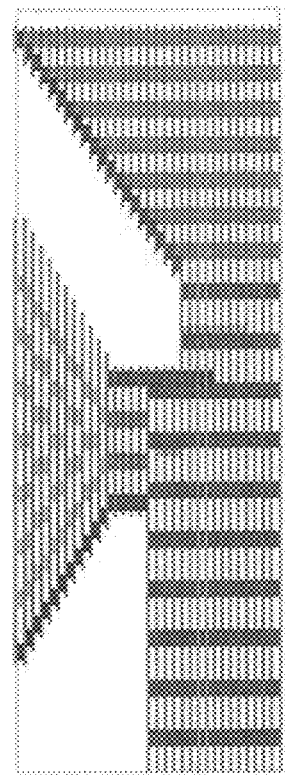
FIG. 13A is a cross-sectional diagram illustrating a structure of a substrate embedded vertical radiation antenna and horizontal radiation antenna implemented using 3-D EM simulation according to another example embodiment.
Figure 13B:
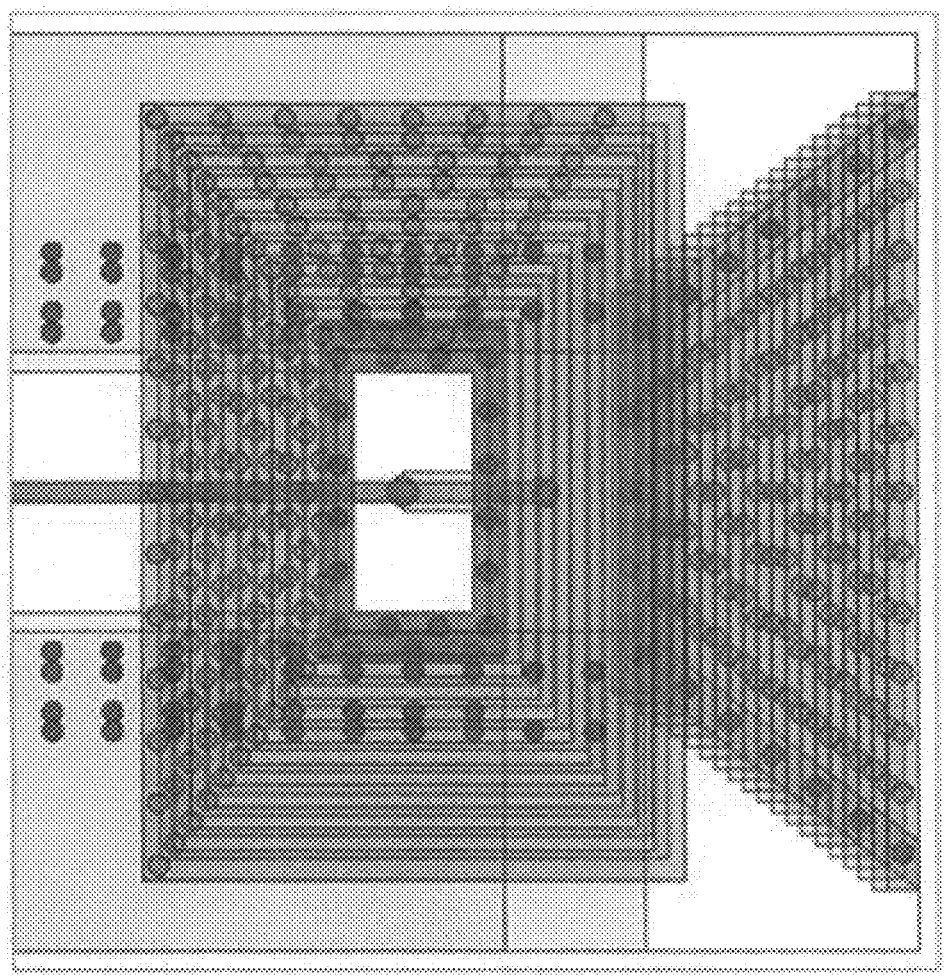
FIG. 13B is a plane diagram illustrating a structure of a substrate embedded vertical radiation antenna and horizontal radiation antenna implemented using 3-D EM simulation according to another example embodiment.
Figure 13C:
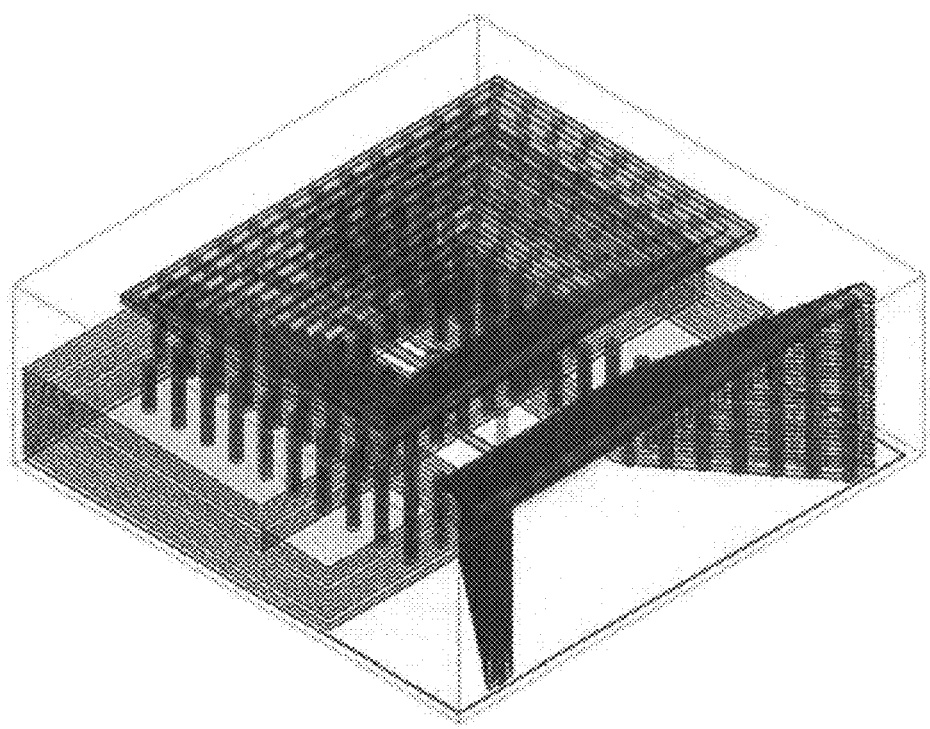
FIG. 13C is a diagram illustrating a structure of a substrate embedded vertical radiation antenna and horizontal radiation antenna implemented using 3-D EM simulation according to another example embodiment.

In FIGS. 13a, 13b and 13c, the simulation result is added to describe the capability of implementing the example embodiments. In this case, the dielectric substrate is used the LTCC substrate (low temperature co-fired ceramic, LTCC). The dielectric constant is 5.9, the loss tangent is 0.0035 and the metal is Ag.

The width of the aperture of the vertical embedded horn antenna is 3.9 mm and the length of the aperture is 2.7 mm. The width of the substrate including the CMOS chip is 4.8 mm and the length of the substrate is 4.6 mm and the height of the substrate is 1.4 mm. The substrate embedded horn antenna may be used to minimize the size.

The result of the example embodiment may be applied to various substrates (PCB, Duroid, Taconic, Ceramic).

FIG. 13A is a cross-sectional diagram illustrating a structure of a substrate embedded vertical radiation antenna and horizontal radiation antenna implemented using 3-D EM simulation according to another example embodiment.

FIG. 13B is a plane diagram illustrating a structure of a substrate embedded vertical radiation antenna and horizontal radiation antenna implemented using 3-D EM simulation according to another example embodiment.

FIG. 13C is a diagram illustrating a structure of a substrate embedded vertical radiation antenna and horizontal radiation antenna implemented using 3-D EM simulation according to another example embodiment.

FIG. 14A is a diagram illustrating a beam pattern of a vertical direction in case a signal is applied by selecting a vertical radiation of a substrate embedded horn antenna according to another example embodiment.

FIG. 14B is a diagram illustrating a beam pattern of a horizontal direction in case a signal is applied by selecting a horizontal radiation of a substrate embedded horn antenna according to another example embodiment

What is claimed is:

1. A substrate embedded horn antenna comprising:
   a dielectric;
   a plurality of metal patterns embedded by being stacked in the dielectric, the plurality of metal patterns being hollow rectangle types or hollow circle types;
   a plurality of metal vias connecting layers of the metal patterns by being embedded between the layers of the metal patterns; and
   a ground plate formed in an upper side of the dielectric,
   wherein the plurality of metal patterns forms a waveguide structure by being stacked in a radial shape,
   wherein the waveguide structure propagates an electromagnetic wave by focusing the electromagnetic wave,
   wherein the substrate embedded horn antenna comprises:
      a first horn antenna vertically embedded in a substrate; and
      a second horn antenna horizontally embedded in the substrate, the first horn antenna overlapping the second horn antenna,
   wherein the first horn antenna has a shape of a hollow rectangular horn or a shape of a hollow circular horn, and
   wherein the second horn antenna has a same shape as the first horn antenna.

2. The substrate embedded horn antenna of claim 1,
   wherein the substrate embedded horn antenna comprises:
      a feeding line placed in the upper side of the dielectric and separated from the ground plate;
      a resonance line connected to a top layer of the metal patterns, the resonance line comprising a length of $\lambda/4$, the $\lambda$ being a wave length of a transfer signal; and
      a via connecting the feeding line and the resonance line, and
   wherein a signal is applied through providing the transfer signal to a waveguide implemented in a substrate and converting a TEM mode to TE01 mode.

3. The substrate embedded horn antenna of claim 2,
   wherein the substrate embedded horn antenna comprises:
      a TX-RX integrated-circuit chip placed in the upper side of the dielectric and horizontally separated from the ground plate,
   wherein a ground pad of the TX-RX integrated-circuit chip and the ground plate are connected through a wire bonding,
   wherein a signal pad of the TX-RX integrated-circuit chip and the feeding line are connected through the wire bonding, and
   wherein the TX-RX integrated-circuit chip is mounted on a cavity formed in the dielectric.

4. The substrate embedded horn antenna of claim 2,
   wherein the substrate embedded horn antenna comprises:

a TX-RX integrated-circuit chip placed in the upper side of the dielectric, wherein a ground pad and a signal pad of the TX-RX integrated-circuit chip are placed in a lower side of the TX-RX integrated-circuit chip, wherein the ground pad and the ground plate are connected through a bump, and wherein the signal pad of the TX-RX integrated-circuit chip and the feeding line are connected through another bump.

5. The substrate embedded horn antenna of claim 1, wherein the substrate embedded horn antenna comprises:
   a transmission line to apply a signal to one of the first horn antenna and the second horn antenna; and
   an input switch to select an operation of the first horn antenna and the second horn antenna, the input switch being connected to a front end of the transmission line, and
wherein only one of the second horn antenna and the first horn antenna is operated in response to selection of the input switch.

6. A substrate embedded horn antenna comprising:
a dielectric;
a plurality of metal patterns embedded by being stacked in the dielectric, the plurality of metal patterns being hollow rectangle types or hollow circle types;
a plurality of metal vias connecting layers of the metal patterns by being embedded between the layers of the metal patterns; and
a ground plate formed in an upper side of the dielectric,
wherein the plurality of metal patterns forms a waveguide structure by being stacked in a radial shape,
wherein the waveguide structure propagates an electromagnetic wave by focusing the electromagnetic wave,
wherein the substrate embedded horn antenna comprises:
   a plurality of first horn antennas horizontally embedded in a same layer of a substrate;
   each of the plurality of first horn antennas being directed in one of a direction of a front side, a direction of a left side, and a direction of a right side; and
   a second horn antenna vertically embedded in the substrate,
wherein the second horn antenna overlaps at least one of the plurality of first horn antennas,
wherein the plurality of first horn antennas and the second horn antenna are selectively operated,
wherein each of the plurality of first horn antennas has a shape of a hollow rectangular horn or a shape of a hollow circular horn, and
wherein the second horn antenna has a same shape as each of the plurality of first horn antennas.

7. The substrate embedded horn antenna of claim 6, wherein the substrate embedded horn antenna comprises:
   a transmission line to apply a signal to at least one of the plurality of first horn antennas and the second horn antenna; and
   an input switch to select an operation of the second horn antenna and the plurality of first horn antennas, the input switch being connected to a front end of the transmission line, and
wherein the plurality of first horn antennas and the second horn antenna are selectively operated.

8. A substrate embedded horn antenna comprising:
a dielectric;
a plurality of metal patterns embedded by being stacked in the dielectric, the plurality of metal patterns being hollow rectangle types or hollow circle types;
a plurality of metal vias connecting layers of the metal patterns by being embedded between the layers of the metal patterns; and
a ground plate formed in an upper side of the dielectric,
wherein the plurality of metal patterns forms a waveguide structure by being stacked in a radial shape,
wherein the waveguide structure propagates an electromagnetic wave by focusing the electromagnetic wave,
wherein the substrate embedded horn antenna comprises:
   a plurality of first horn antennas vertically embedded in a substrate;
   a plurality of second horn antennas horizontally embedded in the substrate, the plurality of second horn antennas respectively overlapping the plurality of first horn antennas; and
   a phase controller to change a phase received by each of the plurality of first horn antennas and the plurality of second horn antennas,
wherein a beam former is implemented using the plurality of second horn antennas, the plurality of first horn antennas, and the phase controller,
wherein the beam former is configured to:
   control a direction of horizontal radiation and a direction of vertical radiation; and
   select at least one of the direction of the horizontal radiation and the direction of the vertical radiation,
wherein each of the plurality of first horn antennas has a shape of a hollow rectangular horn or a shape of a hollow circular horn, and
wherein each of the plurality of second horn antennas has a same shape as each of the plurality of first horn antennas.

9. The substrate embedded horn antenna of claim 8, wherein the substrate embedded horn antenna comprises:
   an input switch to implement the beam former, the input switch being configured to select the vertical direction and the horizontal direction, the input switch being connected to a front end of the phase controller, and
wherein the beam former is configured to control the direction of horizontal radiation and the direction of vertical radiation.

* * * * *